United States Patent
Ji et al.

(10) Patent No.: US 8,771,429 B2
(45) Date of Patent: Jul. 8, 2014

(54) SUPERCRITICAL DRYING METHOD FOR SEMICONDUCTOR SUBSTRATE AND SUPERCRITICAL DRYING APPARATUS

(75) Inventors: Linan Ji, Shanghai (CN); Hidekazu Hayashi, Yokohama (JP); Hiroshi Tomita, Yokohama (JP); Hisashi Okuchi, Yokohama (JP); Yohei Sato, Yokohama (JP); Takayuki Toshima, Koshi (JP); Mitsuaki Iwashita, Nirasaki (JP); Kazuyuki Mitsuoka, Nirasaki (JP); Gen You, Nirasaki (JP); Hiroki Ohno, Nirasaki (JP); Takehiko Orii, Nirasaki (JP)

(73) Assignees: Kabushiki Kaisha Toshiba, Tokyo (JP); Tokyo Electron Limited, Tokyo (JP)

( * ) Notice: Subject to any disclaimer, the term of this patent is extended or adjusted under 35 U.S.C. 154(b) by 63 days.

(21) Appl. No.: 13/420,870

(22) Filed: Mar. 15, 2012

(65) Prior Publication Data
US 2013/0019905 A1    Jan. 24, 2013

(30) Foreign Application Priority Data
Jul. 19, 2011    (JP) .................. 2011-158296

(51) Int. Cl.
  *B08B 7/00*    (2006.01)
(52) U.S. Cl.
  USPC .............................. 134/30; 34/357
(58) Field of Classification Search
  USPC ........................... 134/22.1, 19, 30
  See application file for complete search history.

(56) References Cited

U.S. PATENT DOCUMENTS

| | | | |
|---|---|---|---|
| 5,417,768 A * | 5/1995 | Smith et al. .............. | 134/10 |
| 6,960,242 B2 | 11/2005 | Leitch et al. | |
| 2009/0311874 A1 * | 12/2009 | Tomita et al. ............ | 438/759 |
| 2011/0000512 A1 * | 1/2011 | Toshima et al. ........ | 134/34 |
| 2011/0289793 A1 | 12/2011 | Hayashi et al. | |
| 2012/0048304 A1 | 3/2012 | Kitajima et al. | |
| 2012/0118332 A1 | 5/2012 | Sato et al. | |

FOREIGN PATENT DOCUMENTS

| | | |
|---|---|---|
| JP | 2010-161165 | 7/2010 |
| JP | 2011-014706 | 1/2011 |

OTHER PUBLICATIONS

Notification of Reasons for Rejection issued by the Korean Intellectual Property Office on Jun. 26, 2013, for Korean Patent Application No. 10-2012-26546, and English-language translation thereof.

* cited by examiner

*Primary Examiner* — Michael Barr
*Assistant Examiner* — Caitlin N Dunlap
(74) *Attorney, Agent, or Firm* — Finnegan, Henderson, Farabow, Garrett & Dunner, L.L.P.

(57) ABSTRACT

According to one embodiment, a supercritical drying method for a semiconductor substrate, comprises introducing the semiconductor substrate into a chamber in a state, a surface of the semiconductor substrate being wet with alcohol, substituting the alcohol on the semiconductor substrate with a supercritical fluid of carbon dioxide by impregnating the semiconductor substrate to the supercritical fluid in the chamber, and discharging the supercritical fluid and the alcohol from the chamber and reducing a pressure inside the chamber. The method further comprises performing a baking treatment by supplying an oxygen gas or an ozone gas to the chamber after the reduction of the pressure inside the chamber.

8 Claims, 4 Drawing Sheets

SUPERCRITICAL DRYING METHOD FOR SEMICONDUCTOR SUBSTRATE AND SUPERCRITICAL DRYING APPARATUS

CROSS REFERENCE TO RELATED APPLICATION

This application is based upon and claims benefit of priority from the Japanese Patent Application No. 2011-158296, filed on Jul. 19, 2011, the entire contents of which are incorporated herein by reference.

FIELD

Embodiments described herein relate generally to a supercritical drying method for a semiconductor substrate and a supercritical drying apparatus.

BACKGROUND

A process for producing a semiconductor device includes various process steps such as a lithography step, an etching step, and an ion injection step. After the termination of each of the steps and before shifting to the next step, a cleaning step and a drying step for purging a surface of a wafer by removing impurities and residues remaining on the wafer surface are performed.

For example, in the wafer cleaning step after the etching step, a chemical liquid for a cleaning treatment is supplied to the wafer surface, and then pure water is supplied to perform a rinsing treatment. After the rinsing treatment, a drying treatment for drying the wafer by removing the pure water remaining on the wafer surface is performed.

As a method for performing the drying treatment, for example, a method of drying the wafer by substituting the pure water on the wafer with isopropyl alcohol (IPA) has been known. However, there has been a problem that a pattern formed on the wafer is collapsed by surface tension of the liquid, at the time of the drying treatment.

In order to solve the problem, supercritical drying by which the surface tension is nullified has been proposed. For example, IPA on the wafer is dissolved into the supercritical $CO_2$ fluid by bringing a wafer of which a surface is wet with IPA into a state of being impregnated into carbon dioxide (supercritical $CO_2$ fluid) which is in a supercritical state in a chamber. Subsequently, the supercritical $CO_2$ fluid into which the IPA is dissolved is gradually discharged from the chamber. After that, the wafer is dried by causing a phase shift from the supercritical $CO_2$ fluid to a gas (vapor) by reducing a pressure and a temperature inside the chamber and then discharging the gas to the outside of the chamber.

However, in the phase shift of carbon dioxide from the supercritical state to the gas (vapor) by reducing the pressure inside the chamber, there has been a problem of deposition of particles caused by a drying mark or the like which is generated by cohesion and re-absorption on the wafer of IPA remaining in the chamber in the state of being dissolved into the supercritical $CO_2$ fluid.

DETAILED DESCRIPTION

According to one embodiment, a supercritical drying method for a semiconductor substrate, comprises introducing the semiconductor substrate into a chamber in a state, a surface of the semiconductor substrate being wet with alcohol, substituting the alcohol on the semiconductor substrate with a supercritical fluid of carbon dioxide by impregnating the semiconductor substrate to the supercritical fluid in the chamber, and discharging the supercritical fluid and the alcohol from the chamber and reducing a pressure inside the chamber. The method further comprises performing a baking treatment by supplying an oxygen gas or an ozone gas to the chamber after the reduction of the pressure inside the chamber.

Hereinafter, one embodiment according to the present invention will be described with reference to the drawings.

Figure 1:
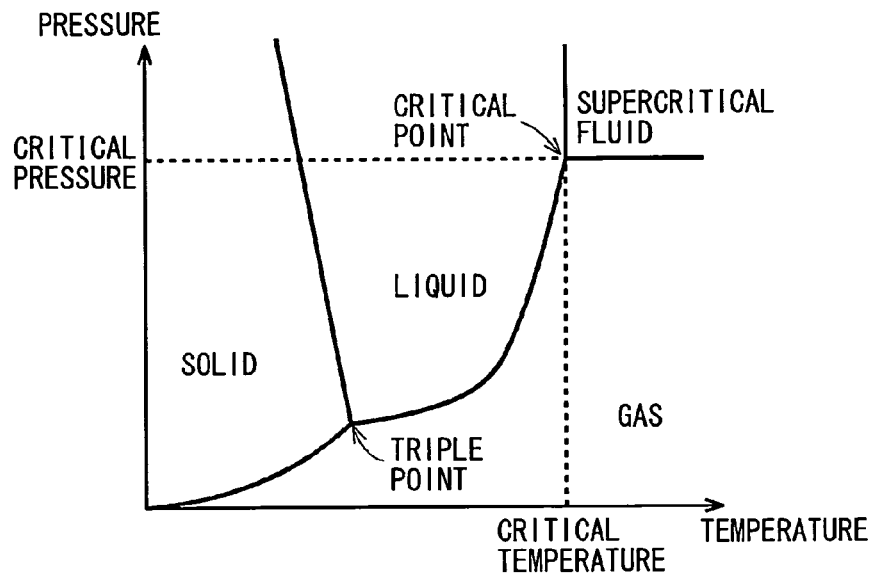
FIG. 1 is a diagram showing a state which indicates a relationship among a pressure, a temperature, and substance phase states.

To start with, a supercritical drying apparatus will be described. FIG. 1 is a diagram showing a state which indicates a relationship among a pressure, a temperature, and substance phase states. A functional substance of a supercritical fluid used for supercritical drying includes three states of being, namely, a vapor phase (gas), a liquid phase (liquid), and a solid phase (solid), which are called three states.

As shown in FIG. 1, the three phases are distinguished from one another by a vapor pressure curve (vapor phase equilibrium line) which indicates a boundary between the vapor phase and the liquid phase, a sublimation curve which indicates a boundary between the vapor phase and the solid phase, and a dissolution curve which indicates a boundary between the solid phase and the liquid phase. A point on which the three phases overlap with one another is the triple point. The vapor curve extending toward the high temperature side from the tripe point reaches a critical point which is the limit of the coexistence of the vapor phase and the liquid phase. On the critical point, since densities of the vapor phase and the liquid phase become equal to each other, a phase boundary of the vapor-liquid coexistence is lost.

In a state of a higher temperature and a higher pressure than the critical point, the vapor phase and the liquid phase are no longer distinguishable, and the substance becomes a supercritical fluid. The supercritical fluid is a fluid which is compressed to a high density at the critical temperature or more. The supercritical fluid is similar to the vapor in the feature that a diffusion force of solvent molecules is dominant. In contrast, the supercritical fluid is similar to the liquid in the feature that an influence of molecule cohesion is not negligible and, therefore, has a property of dissolving various substances.

Further, the supercritical fluid has considerably high wettability as compared to the liquid and is characterized by easy permeation into a minute structure.

Further, by drying the supercritical fluid in such a manner that the supercritical state is directly shifted to the vapor phase, it is possible to attain the drying without damaging the minute structure owing to the prevention of existence of a phase boundary between the vapor and the liquid, i.e. by preventing a capillary force (surface tension). The supercritical drying is the drying of a substrate by utilizing the above-described supercritical state of the supercritical fluid.

As the supercritical fluid to be used for the supercritical drying, carbon dioxide, ethanol, methanol, propanol, butanol, methane, ethane, propane, water, ammonium, ethylene, fluoromethane, or the like may be selected, for example.

Particularly, since carbon dioxide has a critical temperature of 31.1° C. and a critical pressure of 7.37 MPa, which are relatively low temperature and low pressure, respectively, a treatment with carbon dioxide is easy. The supercritical drying treatment in the present embodiment uses carbon dioxide.

Figure 2:
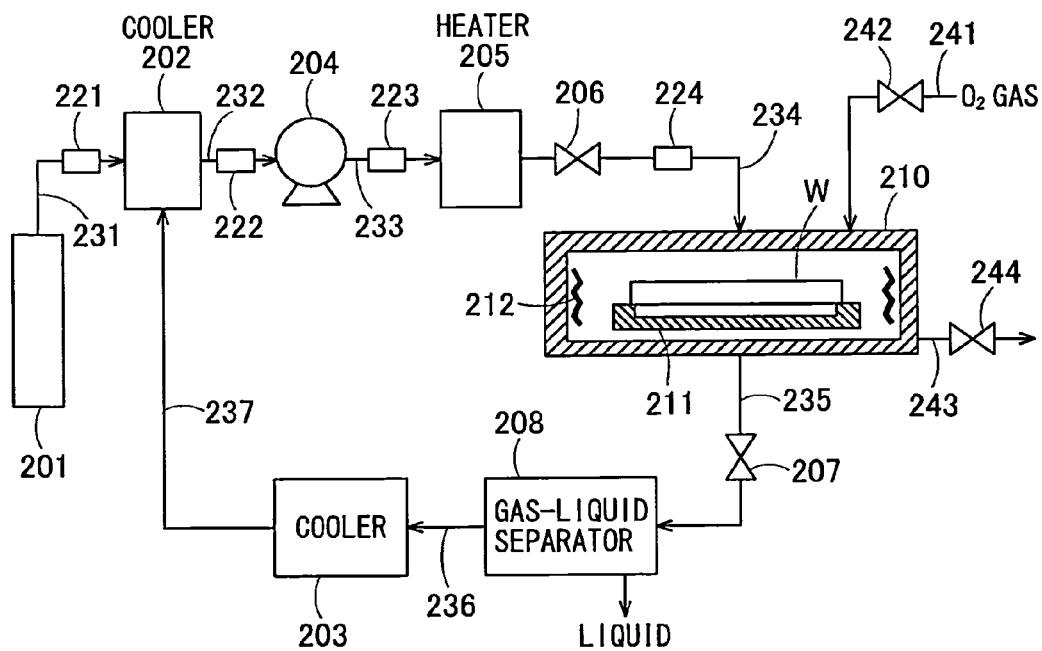
FIG. 2 is a block diagram schematically showing a supercritical drying system according to one embodiment of the present invention.

FIG. 2 is a block diagram schematically showing a supercritical drying system according to one embodiment of the present invention. The supercritical drying system is provided with a bomb 201, cooling devices 202, 203, a pressurization pump 204, a heater 205, valves 206, 207, a vapor-liquid separator 208, and a chamber 210.

The bomb 201 stores carbon dioxide in the liquid form. The pressurization pump 204 withdraws carbon dioxide from the bomb 201 and discharges carbon dioxide by pressurization. Carbon dioxide withdrawn from the bomb 201 is supplied to the cooling device 202 via a pipe 231 to be cooled and then supplied to the pressurization pump 204 via a pipe 232.

The pressurizing pump 204 pressurizes carbon dioxide to discharge carbon dioxide. For example, the pressurization pump 204 pressurizes carbon dioxide to a pressure equal to or higher than the critical pressure. Carbon dioxide discharged from the pressurizing pump 204 is supplied to the heater 205 via a pipe 233. The heater 205 increases (heats) a temperature of carbon dioxide to a temperature equal to or more than the critical temperature.

Carbon dioxide discharged from the heater 205 is supplied to the chamber 210 via a pipe 234. The pipe 234 is provided with the valve 206. The valve 206 adjusts an amount of carbon dioxide to be supplied to the chamber 210.

The pipes 231 to 234 are provided with filters 221 to 224, respectively, for removing particles.

The chamber 210 is formed of SUS and is a high pressure vessel of which predetermined pressure resistance is ensured and can be tightly sealed. The chamber 210 has a stage 211 and a heater 212. The stage 211 is a ring-like flat plate which retains a substrate W to be treated. The heater 212 is capable of adjusting a temperature inside the chamber 210. The heater 212 may be provided with an outer periphery of the chamber 210.

The vapor and the supercritical fluid inside the chamber 210 are discharged via a pipe 235. The pipe 235 is provided with the valve 207. It is possible to adjust a pressure inside the chamber 210 by a degree of opening of the valve 207. The supercritical fluid becomes a vapor at a downstream side from the valve 207 of the pipe 235.

The vapor-liquid separator 208 separates a vapor and a liquid from each other. For example, in the case where carbon dioxide in the supercritical state into which alcohol is dissolved is discharged from the chamber 210, the vapor-liquid separator 208 separates the alcohol which is the liquid and carbon dioxide which is the vapor from each other. The separated alcohol is reusable.

Carbon dioxide in the vapor form discharged from the vapor-liquid separator 208 is supplied to the cooling device 203 via a pipe 236. The cooling device 203 changes carbon dioxide into a liquid form by cooling and then discharges carbon dioxide to the cooling device 202 via a pipe 237. Carbon dioxide discharged from the cooling device 203 is supplied to the pressurization pump 204. With such configuration, it is possible to attain cyclic use of carbon dioxide.

Further, as shown in FIG. 2, the supercritical drying system is provided with a pipe 241 which is connected to the chamber 210 to supply an oxygen gas to the chamber 210 and a pipe 243 which discharges the oxygen gas and the like from the chamber 210. Further, the pipes 241,243 are provided with openable and closable valves 242, 244, respectively. In FIG. 2, a bomb which stores the oxygen gas, a pump which feeds oxygen to the chamber 210, a controller which controls the heater 212, and the like are not shown.

In order to perform a baking treatment in the chamber 210, the oxygen gas is supplied to the chamber 210. The baking treatment enables to eliminate organic substances in the chamber 210 by burning (oxidization). In the present embodiment, the case of supplying the oxygen gas to the chamber 210 is described, but it is possible to use an oxidizing gas such as an ozone gas. The pipe 241 which supplies the oxygen gas or the ozone gas may be provided with a UV lamp which activates the oxygen gas or the ozone gas.

Figure 3:
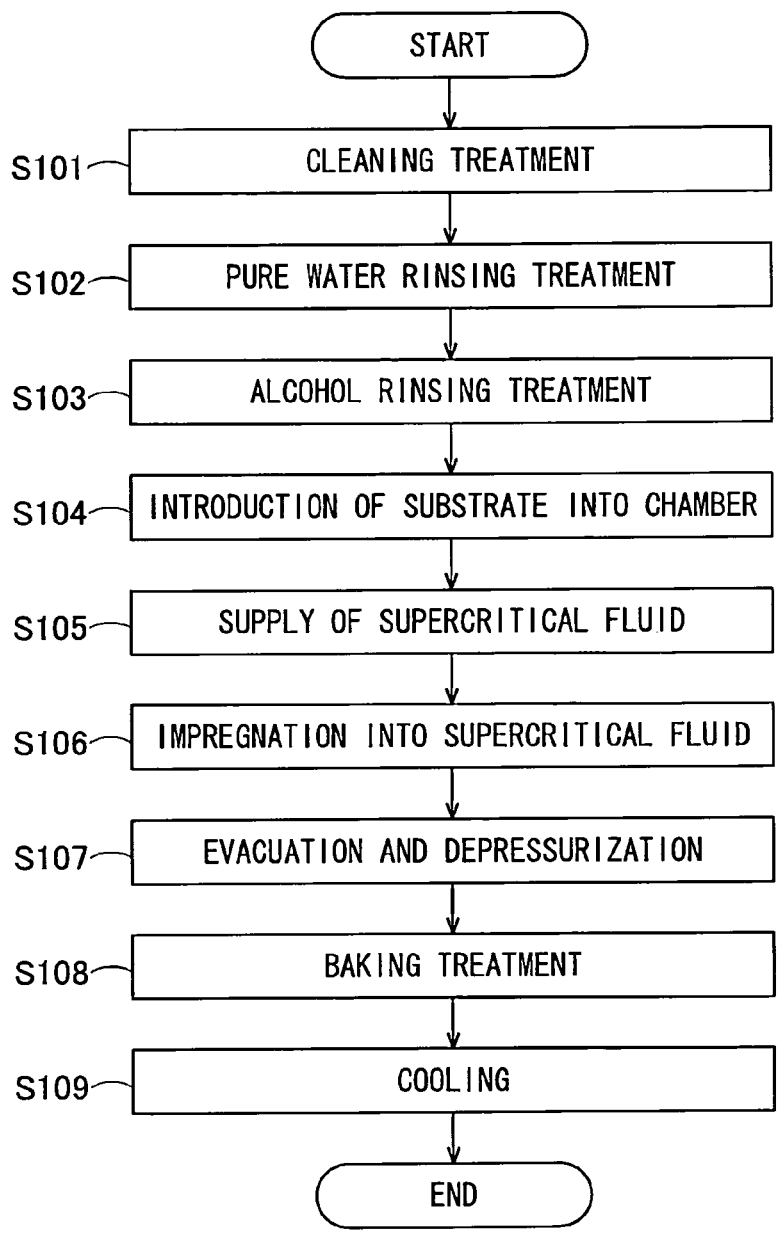
FIG. 3 is a flowchart illustrating a supercritical drying method according to the embodiment.

Shown in FIG. 3 is a flowchart illustrating a method of cleaning and drying a semiconductor substrate according to the present embodiment.

(Step S101) A semiconductor substrate to be treated is conveyed to a cleaning chamber. A chemical liquid is supplied onto the surface of semiconductor substrate to perform a cleaning treatment. As the chemical liquid, sulfuric acid, hydrofluoric acid, hydrochloric acid, hydrogen peroxide, or the like may be used.

The cleaning treatment includes a treatment of stripping a resist from the semiconductor substrate, a treatment of removing particles and metal impurities, a treatment of performing etching to remove a film formed on the substrate, and the like.

(Step S102) A pure water rinsing treatment is performed, in which pure water is supplied onto the surface of the semiconductor substrate to rinse off the chemical liquid remaining on the surface of the semiconductor substrate with pure water.

(Step S103) An alcohol rinsing treatment is performed, in which alcohol is supplied onto the surface of the semiconductor substrate to substitute the pure water remaining on the surface of the semiconductor substrate with the alcohol. As the alcohol, those which can be dissolved into both of the pure water and the supercritical carbon dioxide fluid are usable (for easy substitution). In the present embodiment, isopropyl alcohol (IPA) is used in the following description.

(Step S104) The semiconductor substrate is conveyed out of the cleaning chamber in a state where the surface is wet with IPA and is not naturally dried, and then introduced into the chamber 210 of the supercritical drying system shown in FIG. 2 to be fixed to the stage 211. After the fixation of the semiconductor substrate, the chamber 210 is tightly sealed.

(Step S105) A carbon dioxide gas inside the bomb 201 is pressurized and heated by the pressurization pump 204 and the heater 205 to be supplied to the chamber 210 via the pipe 234. The valves 207, 242, and 244 are closed, and the valve 206 is opened.

When a pressure and a temperature inside the chamber 210 reach a pressure equal to or more than a critical pressure and a temperature equal to or more than a critical temperature, carbon dioxide in the chamber 210 becomes a supercritical fluid (is in the supercritical state). Further, at a downstream side from the valve 206 on the pipe 234 which is connected to the chamber 210 (in the pipe 234 between the valve 206 and the chamber 210), carbon dioxide becomes a supercritical fluid. Here, a temperature T inside the chamber 210 is adjusted to a temperature ranging from 75° C. to a temperature less than a critical temperature of IPA (235.6° C.) by using the heater 212. The supercritical drying is performed by adjusting the temperature T inside the chamber 210 to the above-specified temperature range, and it is desired to adjust a temperature in the vicinity of the wafer surface to the temperature range in practice. The reason for setting the temperature T to the above-specified temperature range will be described later in this specification.

Figure 4:
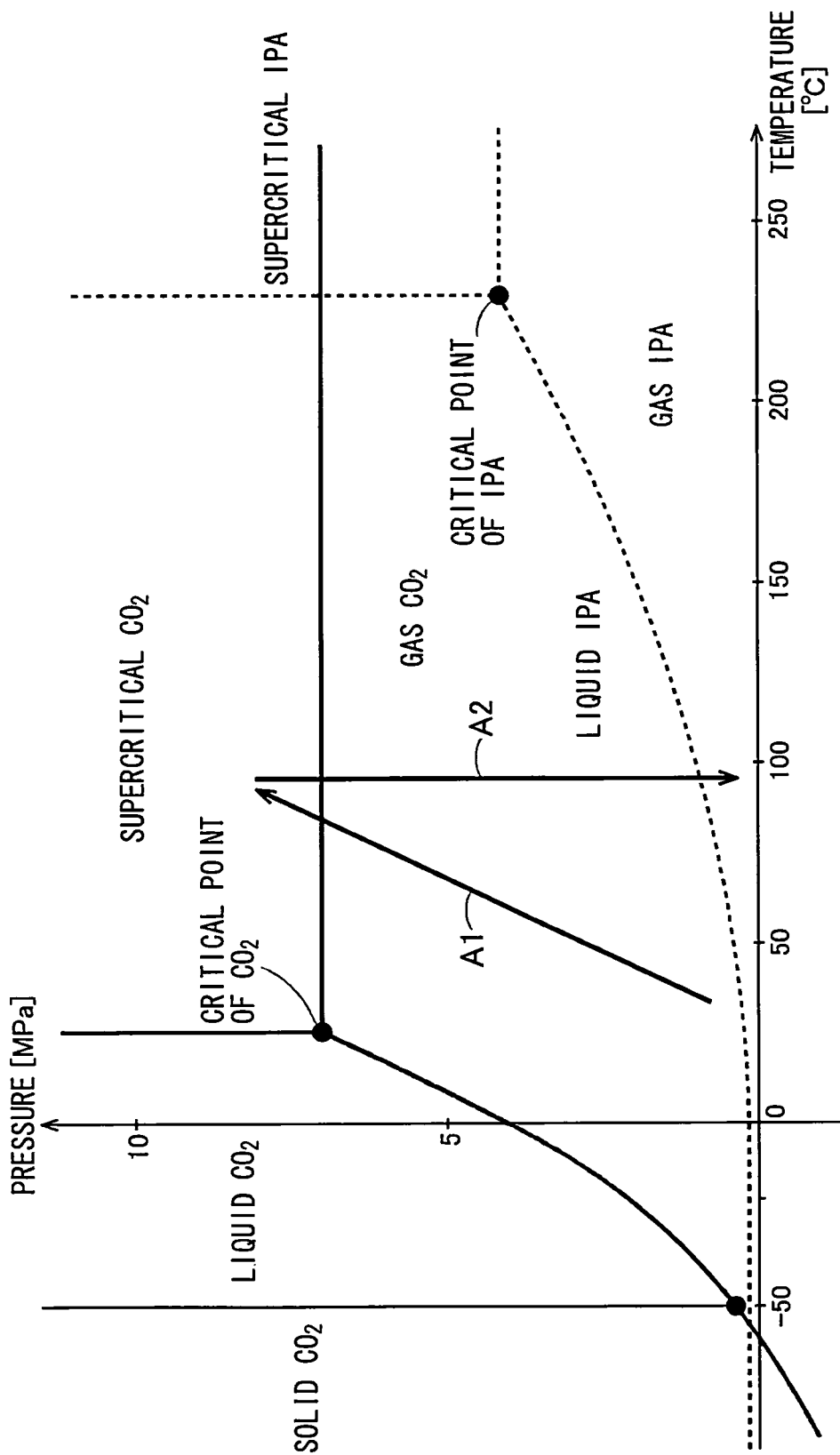
FIG. 4 is a diagram showing states of carbon dioxide and IPA.

FIG. 4 is a diagram showing a state which indicates a relationship among a pressure, a temperature, and phase states of each of carbon dioxide and IPA. In FIG. 4, thick line corresponds to carbon dioxide, and a dashed line corresponds to IPA. Changes of carbon dioxide in the chamber 210 in the present step correspond to an arrow A1 in FIG. 4.

(Step S106) The semiconductor substrate is impregnated into the supercritical $CO_2$ fluid for a predetermined time, for example, for about 20 minutes. Thus, IPA on the semiconductor substrate is dissolved into the supercritical $CO_2$ fluid to be removed from the semiconductor substrate. In other words, IPA on the semiconductor substrate is substituted with the supercritical $CO_2$ fluid.

Here, the valve 207 is opened during the supercritical $CO_2$ fluid is supplied to the chamber 210 via the pipe 234 in order that the supercritical $CO_2$ fluid into which IPA is dissolved is gradually discharged from the chamber 210 via the pipe 235.

Further, the heater 212 is controlled so as to keep the temperature set in Step S105 as the temperature T inside the chamber 210.

(Step S107) The valve 207 is opened for evacuation in order to reduce the pressure inside the chamber 210 (see an arrow A2 in FIG. 4). The heater 212 is controlled so as to keep the temperature which is set in Step S105 as the temperature during the evacuation and depressurization inside the chamber 210. Carbon dioxide inside the chamber 210 is changed from the supercritical state to a vapor state by the pressure reduction inside the chamber 210 as indicated by the arrow A2 of FIG. 4, and IPA is changed from the liquid state to a vapor state.

The temperature T inside the chamber 210 during the depressurization may be fluctuated insofar as the temperature T is 75° C. or more and less than the critical temperature (235.6° C.) of IPA. The supercritical drying is performed with the temperature T inside the chamber 210 being kept within the above-specified temperature range, but, in practice, carbon dioxide supercritical drying temperature is adjusted in such a manner that the temperature in the vicinity of the wafer surface is within the temperature range.

In Steps S105 to S107, a cluster of the solvent (IPA) which is dissolved into the supercritical $CO_2$ fluid is downsized by increasing the temperature T inside the chamber 210 to 75° C. or more, and, therefore, it is possible to downsize the particles falling onto the semiconductor substrate due to cohesion of the solvent during the evacuation and depressurization in Step S107. Further, even when the solvent is cohered, it is possible to vaporize the solvent before falling onto the semiconductor substrate.

In contrast, when the temperature T is a temperature which is equal to or more than the critical temperature of IPA, IPA is brought into the supercritical state to generate products decomposed from IPA, and a metal film formed on the semiconductor substrate, which contains tungsten, titanium, or titanium nitride, is etched. In Steps S105 to S107, it is possible to suppress the etching of the metal film and to prevent deterioration of electric characteristics of the semiconductor device by keeping the temperate T to the temperature which is less than the critical temperature of IPA.

(Step S108) When the pressure inside the chamber 210 reaches a pressure which is less than 1 MPa (for example, atmospheric pressure=0.1 MPa), the valves 206, 207 are closed, and the valves 242, 244 are opened, followed by supply of the oxygen gas to the chamber 210. The temperature inside the chamber is increased by using the heater 212 to perform the baking treatment.

An organic component (oil component) is contained in carbon dioxide to be used as the supercritical fluid, and the organic component adheres to the semiconductor substrate. The baking treatment in the present step is for the purpose of eliminating the organic component by burning. Therefore, it is possible to reduce particles originated from the organic component on the semiconductor substrate by the baking treatment.

Further, it is possible to eliminate the organic component which is deposited on an inner wall or the like of the chamber 210 by burning through the baking treatment. The burnt organic component is discharged from the chamber 210 via the pipe 243.

In the present step, a degree of the increase of the temperature inside the chamber 210 varies depending on the organic component to be burnt (organic component contained in carbon dioxide to be used). In Table 1 below, examples of the organic components which can be contained in commercially available carbon dioxide products and thermodecomposition temperatures or boiling points thereof are shown.

TABLE 1

| | |
|---|---|
| Aromatic polyamide | Thermodecomposition temperature: 500° C. |
| Carbonate, calcium carbonate | Thermodecomposition temperature: 825° C. |
| Vinyl chloride resin (polyvinyl chloride (PVC), polyaluminum chloride (PAC), epoxy (EP), polystyrene (PS), polypropylene (PP), polyethylene (PE), teflon (TF)) | Thermodecomposition temperature: 350° C. to 600° C. |
| Phthalic acid ester (PAE) | Thermodecomposition temperature: 231° C. |
| Fluorine resin (PTFE) | Thermodecomposition temperature: 550° C. |
| Meta-aramid | Thermodecomposition temperature: 400° C. to 500° C. |
| 2-butoxy-ethanol, ethyleneglycol, monobutylether | Boiling point: 197.85° C. |
| Acetaldehyde diethyl acetal | Thermodecomposition temperature: 230° C. |
| 2-ethyl-1-hexanol | Boiling point: 183.5° C. |
| 1,2-diethylbenzenedicarbonate, 2,2-dimethoxypropane, dimethyl phthalate (DMP) | Boiling point: 283° C. to 284° C. |
| 1,2-dibutylesterbenzendicarbonate, dibutyl phthalate (DBP) | Boiling point: 340° C. |
| Hexane | Boiling point: 69° C. |
| Hexano | Boiling point: 125° C. to 139.8° C. |
| Ethyl hexanoate | Boiling point: 167.7° C. |
| Octane | Boiling point: 125.67° C. |
| Octanol | Boiling point: 167° C. to 195° C. |
| Ethyl octanoate | Boiling point: 208.5° C. |
| Decane | Boiling point: 174.2° C. |
| Decalone | Boiling point: 243° C. to 250° C. |
| Ethyl decanoate | Boiling point: 241.5° C. |
| Hexadecane | Boiling point: 287° C. |

Therefore, it is preferable to detect the organic component of carbon dioxide contained in the bomb 201 to be used for the supercritical drying system shown in FIG. 2 before starting the supercritical drying treatment and to increase the temperature in S108 to the temperature at which the organic component is burnt (vaporized) based on the detection result, i.e. to a temperature equal to or more than the thermodecomposition temperature or the boiling point.

(Step S109) After the baking treatment, the semiconductor substrate is conveyed to a cooling chamber (not shown) to be cooled.

Figure 5A:
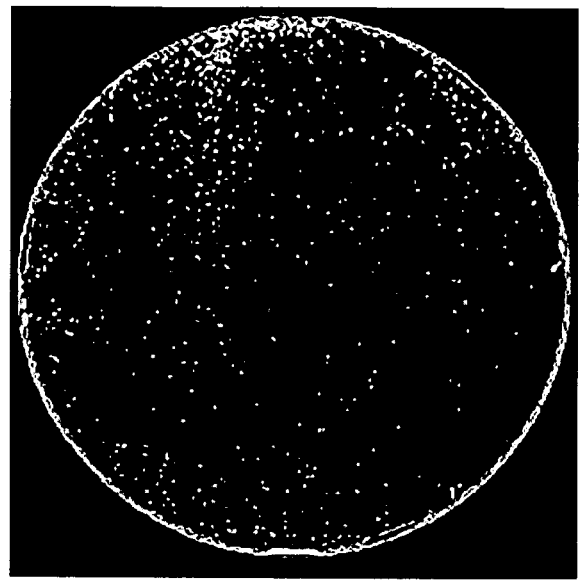
FIGS. 5A and 5B are diagrams showing surfaces of semiconductor substrates after supercritical drying treatments in the cases of performing a baking treatment and not performing the baking treatment.
Figure 5B:
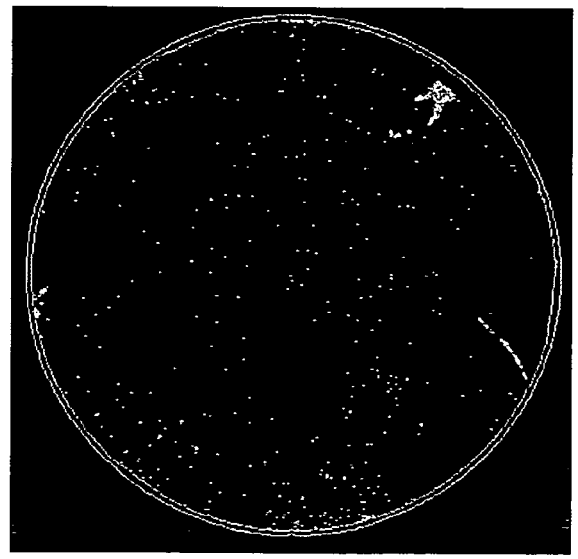

Results obtained in the case of not performing the baking treatment of Step S108 and in the case of performing the baking treatment are shown in FIGS. 5A and 5B. In the experiment, the temperature T was set to 150° C., and a 4N-grade product was used as carbon dioxide. The size of a semiconductor substrate used for the experiment was 300 mm.

Shown in FIG. 5A is a surface of the semiconductor substrate after a supercritical drying treatment in the case of not performing the baking treatment, and the number of particles having the size of 40 nm or more was 4252.

In contrast, shown in FIG. 5B is a surface of the semiconductor substrate after a supercritical drying treatment in the case of performing the baking treatment at 295° C. for 5 minutes by supplying oxygen after evacuation and depressurization of the chamber 210, and the number of particles having the size of 40 nm or more was 1825. It is confirmed that it is possible to reduce the number of particles by reducing the generation of particles attributable to the organic component in carbon dioxide by performing the baking treatment.

Further, the number of particles having the size of 40 nm or more on a semiconductor substrate was measured after a drying treatment was performed by omitting the baking treatment of Step S108 in the present embodiment and setting the temperature T in Steps S105 to S107 to 40° C., 75° C., and 97° C. In step S105, the pressure (partial pressure of carbon dioxide) inside the chamber 210 was increased to 8 MPa (more than the critical pressure), and the size of the semiconductor substrate was 300 mm.

As a result, the number of particles on the semiconductor substrate in the case where the temperature T was 40° C. was 60000 or more, which means an overflow (more than the set value of the particle measurement device); the number of particles in the case of 75° C. was 35639; and the number of particles in the case of 97° C. was 9279. The smaller number of particles on the substrate is more preferred. At the temperature of 40° C., many particles were deposited on the semiconductor substrate to make the measurement impossible. Therefore, the temperature T may preferably be 75° C. or more, more preferably 97° C. or more.

As described above, by substituting IPA on the semiconductor substrate with the supercritical $CO_2$ fluid and setting the temperature in the chamber 210 to a temperature ranging from 75° C. to a temperature less than the critical temperature (235.6° C.) according to the present embodiment, it is possible to reduce the particles attributable to the substitution solvent (IPA in the present embodiment) generated on the semiconductor substrate. Further, it is possible to prevent deterioration of electric characteristics of the semiconductor device by suppressing etching of the metal film containing tungsten, titanium, or titanium nitride during the drying treatment of the semiconductor substrate.

Further, it is possible to reduce the particles attributable to the organic component contained in carbon dioxide by performing, after the evacuation and depressurization of the chamber 210, the baking treatment including supplying an oxidizing gas such as oxygen to the chamber 210, increasing the temperature inside the chamber 210, and burning the organic component.

The baking treatment of Step S108 is performed inside the chamber 210 in the present embodiment, but the baking treatment may be performed in a different chamber. In such case, the different chamber is provided with the mechanism for supplying the oxygen gas or ozone gas and the heater. Here, a UV lamp for activating the oxygen gas or the ozone gas may be provided on the pipe for supplying the oxygen gas or the ozone gas.

The example of using IPA for the alcohol rinsing treatment is described in the present embodiment, but ethanol, methanol, alcohol fluoride, or the like may be used. In this case, the temperature T inside the chamber 210, which is set in Step S105, is set to a temperature less than a critical temperature of the alcohol to be used.

The example of conveying the semiconductor substrate to the cooling chamber which is different from the chamber 210 after the baking treatment is described in the present embodiment, but the cooling of the semiconductor substrate may be performed inside the chamber 210 by providing the cooling mechanism to the chamber 210.

The supercritical drying system which cyclically uses carbon dioxide is described in the present embodiment, but the configuration of the supercritical drying system is not limited to the description, and a configuration which does not cyclically use carbon dioxide may be selected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A supercritical drying method for a semiconductor substrate, comprising:
    introducing the semiconductor substrate into a chamber, a surface of the semiconductor substrate being wet with alcohol;
    substituting the alcohol on the semiconductor substrate with a supercritical fluid of carbon dioxide;
    discharging the supercritical fluid and the alcohol from the chamber while reducing a pressure inside the chamber; and
    performing a baking treatment in the treatment chamber while supplying an oxygen gas or an ozone gas to the chamber after the reduction of the pressure inside the chamber.

2. The supercritical drying method for a semiconductor substrate according to claim 1, wherein the temperature inside the chamber is increased to a temperature equal to or more than the thermodecomposition temperature or the boiling point of an organic component contained in the carbon dioxide before performing the baking treatment.

3. The supercritical drying method for a semiconductor substrate according to claim 1, further comprising:
    cleaning the semiconductor substrate with a chemical liquid;
    rinsing the semiconductor substrate with pure water after the cleaning of the semiconductor substrate with the chemical liquid; and
    rinsing the semiconductor substrate with the alcohol after the rinsing of the semiconductor substrate with the pure water and before the introducing the semiconductor substrate into the chamber.

4. The supercritical drying method for a semiconductor substrate according to claim 1, wherein
    the semiconductor substrate has a metal film formed thereon; and the temperature inside the chamber is maintained at 75° C. or more, and less than a critical temperature of the alcohol during the substituting the alcohol on the semiconductor substrate with the supercritical fluid and during the reducing the pressure inside the chamber.

5. The supercritical drying method for a semiconductor substrate according to claim 4, wherein
the temperature inside the chamber is maintained at 97° C. or more during substituting the alcohol on the semiconductor substrate with the supercritical fluid and during the reducing the pressure inside the chamber.

6. The supercritical drying method for a semiconductor substrate according to claim 4, wherein the metal film contains tungsten, titanium, or titanium nitride.

7. The supercritical drying method for a semiconductor substrate according to claim 1, wherein the oxygen gas or the ozone gas is supplied to the chamber when the pressure inside the chamber is atmospheric pressure.

8. The supercritical drying method for a semiconductor substrate according to claim 1, wherein the alcohol is isopropyl alcohol.

\* \* \* \* \*